(12) United States Patent
Su et al.

(10) Patent No.: US 6,493,199 B1
(45) Date of Patent: Dec. 10, 2002

(54) VERTICAL ZENER-TRIGGERED SCR STRUCTURE FOR ESD PROTECTION IN INTEGRATED CIRCUITS

(75) Inventors: Kung-Yen Su, San Jose, CA (US); Chun-Mai Liu, San Jose, CA (US); Wei-Fan Chen, Hsin Chu (TW)

(73) Assignee: Winbond Electronics Corporation, Hsinchu (TW)

( * ) Notice: Subject to any disclaimer, the term of this patent is extended or adjusted under 35 U.S.C. 154(b) by 126 days.

(21) Appl. No.: 09/697,928

(22) Filed: Oct. 26, 2000

(51) Int. Cl.[7] .................................................. H02H 9/00
(52) U.S. Cl. ............................ 361/56; 361/111; 257/535
(58) Field of Search ........................ 361/56, 91.5, 91.9, 361/111; 257/173, 535

(56) References Cited

U.S. PATENT DOCUMENTS

| | | | | |
|---|---|---|---|---|
| 5,225,702 A | * | 7/1993 | Chatterjee | 257/360 |
| 5,343,053 A | * | 8/1994 | Avery | 257/173 |
| 5,602,404 A | * | 2/1997 | Chen et al. | 257/112 |
| 5,780,905 A | | 7/1998 | Chen et al. | |
| 5,808,342 A | | 9/1998 | Chen et al. | |
| 5,856,214 A | * | 1/1999 | Yu | 438/133 |
| 5,907,462 A | * | 5/1999 | Chatterjee et al. | 361/56 |
| 5,909,347 A | * | 6/1999 | Yu | 361/56 |
| 5,949,634 A | * | 9/1999 | Yu | 361/111 |
| 5,959,821 A | * | 9/1999 | Voogel | 361/111 |
| 6,016,002 A | | 1/2000 | Chen et al. | |
| 6,055,143 A | * | 4/2000 | Yu | 361/56 |
| 6,081,002 A | | 6/2000 | Amerasekera et al. | |
| 6,177,298 B1 | * | 1/2001 | Quigley | 438/135 |

* cited by examiner

Primary Examiner—Adolf Deneke Berhane
(74) Attorney, Agent, or Firm—Blakely, Sokoloff, Taylor & Zafman LLP

(57) ABSTRACT

A silicon controlled rectifier (SCR) serving as an electrostatic discharge (ESD) protection device having a vertical zener junction for triggering breakdown. The SCR includes a p-doped substrate having an n-doped well, spaced-apart $p^+$ and $n^+$ doped regions for cathode connection formed within the n-doped well, and spaced-apart $p^+$ and $n^+$ doped regions for anode connection formed with the p-substrate external to the n-doped well. The SCR further includes a vertical zener junction situated between the anode $n^+$ doped region and the n-well. The vertical zener junction has a $p^+$ doped region sandwiched between two $n^+$ doped regions. The $n^+$ doped region of the vertical zener junction closest to the n-well may extend at least partially within the n-well, or be totally outside of the n-well. The SCR may further include respective field oxides between the anode $p^+$ and $n^+$ doped regions, between the anode $n^+$ doped region and the vertical zener junction, and between the vertical zener junction and the n-doped well. Also provided is an n-doped substrate version of the SCR. The SCR with the vertical zener junction is characterized as having a relatively low breakdown voltage, having improved current handling capability for more reliable and robust operations, and having a breakdown voltage dependent on the doping concentration of the lighter doped $p^+$ or $n^+$ doped region of the vertical zener junction.

16 Claims, 2 Drawing Sheets

VERTICAL ZENER-TRIGGERED SCR STRUCTURE FOR ESD PROTECTION IN INTEGRATED CIRCUITS

FIELD OF THE INVENTION

This invention relates generally to silicon controlled rectifiers (SCRs) as used for electrostatic discharge (ESD) protection in integrated circuits, and in particular, to an SCR structure having a breakdown voltage that is triggered by a vertical zener structure to provide much lower threshold voltage.

BACKGROUND OF THE INVENTION

The protection of integrated circuits against electrostatic discharge (ESD) is an important design consideration for integrated circuits. Integrated circuits are often susceptible to electrostatic discharge. For instance, substantial electrostatic charges can accumulate on a person's body during regular daily activities, such as walking on a carpet. If such a person subsequently comes in contact with a grounded integrated circuit, the charges on the person can discharge through that integrated circuit. Such a discharge produces a relatively large current which can cause damage to the integrated circuit.

In order to reduce the likelihood of damage to integrated circuits due to electrostatic discharge, ESD protection circuits or devices are designed into integrated circuits. One such device is a silicon controlled rectifier (SCR). An SCR is a semiconductor device consisting of an anode terminal followed by p-n-p-n doped layers and then a cathode terminal. The second p-doped layer typically serves as a control terminal for receiving a voltage which governs the current (or conduction) from the anode to the cathode.

As an ESD device, the control terminal typically is tied to the cathode of the SCR, and the SCR is typically connected across the integrated circuit input/output pad and ground potential. During an ESD event, sufficient amount of charges build-up on the integrated circuit input/output pad that causes the SCR to rapidly breakdown and conduct current with a very low intrinsic resistance. The rapid conduction of the SCR causes the charges on the integrated circuit input/output pad to discharge through the grounded cathode of the SCR. This action prevents the excessive charge from damaging the integrated circuit.

FIG. 1 illustrates a side cross-sectional view of a prior art SCR 100. The SCR 100 comprises a p-doped substrate 102 and an n-doped well 104 formed within the substrate 102. The SCR 100 further includes spaced-apart p$^+$ doped region 106 and n$^+$ doped region 108 formed within the n-well 104. Additionally, the SCR 100 further includes spaced apart p$^+$ doped region 110 and n$^+$ doped region 112 formed within the p-substrate 102. A field oxide layer 114 separates the p$^+$ doped region 110 from the n$^+$ doped region 112, and another field oxide layer 116 separates the n$^+$ doped region 112 from the n-well 104.

To serve as an ESD protection device, the p$^+$ region 106 and n$^+$ region 108 of the SCR 100 are typically connected to the input/output pad, and the p$^+$ region 110 and n$^+$ region 112 are typically connected to Vss. When an ESD event occurs, the SCR 100 breakdowns at the junction of the p-substrate 102 and the n-well 104.

A problem with the prior art SCR 100 is that its breakdown voltage is too high to provide adequate protection of the integrated circuit. It is a trend in the semiconductor field to reduce the size of device structures, also reducing gate oxide thickness. Although the size reduction of device structures makes better efficient use of integrated circuit area, the structures are more susceptible to ESD damage due to their smaller geometry and thinner gate oxide. Thus, in order to better protect these structures, an SCR with a lower breakdown voltage would be more desirable. Consequently, recent prior art SCRs have been developed that provides lower breakdown voltages.

FIG. 2 illustrates a side cross-sectional view of a prior art SCR 200 that includes a mechanism for triggering breakdown at a lower voltage. The SCR 200 has been termed in the relevant art as a medium voltage triggered SCR (MVTSCR). Similar to SCR 100 discussed above, SCR 200 comprises a p-substrate 202 having an n-well 204, spaced apart p$^+$ region 206 and n$^+$ region 208 formed within the n-well 204, spaced apart p$^+$ region 210 and n$^+$ region 212 formed in the p-substrate 202, and a field oxide 214 separating the p$^+$ region 210 from the n$^+$ region 212.

To provide a lower breakdown voltage, the SCR 200 further includes an n$^+$ region 218 which bridges the n-well 204 with the p-substrate 202. A field oxide 216 is provided between n$^+$ regions 212 and 218. This SCR has an advantage of providing a lower breakdown voltage due to the added n$^+$ region 218. However, the breakdown voltage is still not low enough to provide adequate protection. Also, the SCR 200 has a disadvantage of having the breakdown occur along a small region near the interface of the n$^+$ region 218 and the field oxide 216, which limits its current handling capability.

FIG. 3 illustrates a side cross-sectional view of another prior art SCR 300 that also includes a mechanism for triggering breakdown at a lower voltage. The SCR 300 has been termed in the relevant art as a low voltage triggered SCR (LVTSCR). Similar to SCRs 100 and 200 discussed above, SCR 300 comprises a p-substrate 302 having an n-well 304, spaced apart p$^+$ region 306 and n$^+$ region 308 formed within the n-well 304, spaced apart p$^+$ region 310 and n$^+$ region 312 formed in the p-substrate 302, a field oxide 314 separating the p$^+$ region 310 from the n$^+$ region 312, and an n$^+$ region 318 bridging the n-well 304 with the p-substrate 302.

To provide an even lower breakdown voltage, the SCR 300 further includes a gate polysilicon 320 to trigger breakdown. Similarly, this SCR has an advantage of providing a lower breakdown voltage due to the added gate polysilicon 320. However, the breakdown voltage is still not low enough to provide adequate protection. Also, the SCR 300 has a disadvantage of having the breakdown occur along a small region near the interface of the n$^+$ region 318 and the gate polysilicon 320, which limits its current handling capability. Also, structure 300 makes the integrated circuit more difficult to design and to manufacture due to the newly added MOSFET device 320.

FIG. 4 illustrates a side cross-sectional view of yet another prior art SCR 400 that also includes a mechanism for triggering breakdown at a lower voltage. Similar to the previous SCRs, SCR 400 comprises a p-substrate 402 having an n-well 404, spaced apart p$^+$ region 406 and n$^+$ region 408 formed within the n-well 404, spaced apart p$^+$ region 410 and n$^+$ region 412 formed in the p-substrate 402, and a field oxide 414 separating the p$^+$ region 410 from the n$^+$ region 412.

To provide an even lower breakdown voltage, the SCR 400 further includes a lateral zener junction 417 comprised of p$^+$ region 418 adjacent a deeper n$^+$ region 420. The lateral zener junction is separated from the n$^+$ region 412 by field oxide 416, and separated from the n-well 404 by field oxide 422. Similarly, this SCR has an advantage of providing a lower breakdown voltage due to the added zener junction 417 which triggers the breakdown of the SCR 400. However, the SCR 400 still has the disadvantage of having the breakdown occur along a thin plane region at the interface of the $p^+$ region 418 and the deeper $n^+$ region 420, which limits its current handling capability. Also, the process related to this structure could be more complex.

Thus, there is a need for an SCR that can be triggered at a relatively low voltage to provide better ESD protection of integrated circuit structures, including thin gate oxides. Also, there is a need for an SCR whose breakdown voltage can be easily set by a simple process procedure. In addition, there is a need for an SCR that has a higher current handling capability.

SUMMARY OF THE INVENTION

The above-identified needs are satisfied with a new and improved silicon controlled rectifier (SCR) in accordance with the invention. The SCR of the invention comprises a vertical zener junction which serves as a mechanism for triggering breakdown. The vertical zener junction can be easily designed to provide a relatively low breakdown voltage for the required protection, which typically lies above the maximum Vdd and below the gate oxide breakdown voltage. The vertical zener junction, which includes a $p^+$ doped region sandwiched between two $n^+$ doped regions, can be easily designed to trigger the breakdown at a desired voltage by adjusting the doping concentration of the region (either the $p^+$ or $n^+$ doped region) having the lesser doping concentration. Also, the SCR of the invention has improved current handling capability since the breakdown occurs throughout the $p^+$ region, which makes the SCR more reliable and robust.

More specifically, the SCR of the invention comprises a p-doped substrate having an n-doped well, spaced apart $p^+$ and $n^+$ doped region formed within the n-doped well, and spaced $p^+$ and $n^+$ doped regions formed within the p-substrate external to the n-doped well. The SCR further includes a vertical zener junction to assist the triggering of the breakdown in the SCR. The vertical zener junction comprises a $p^+$ doped region sandwiched between two $n^+$ doped regions. The vertical zener junction is situated between the n-doped well and the $n^+$ doped region of the SCR anode.

The $n^+$ doped region of the vertical zener diode closest to the n-doped well, could be at least partially formed within the n-doped well or can be form outside of the n-doped well. In the exemplary implementation, the $p^+$ doped region of the vertical zener junction extends deeper into the p-substrate than its two $n^+$ doped regions. The SCR may further include respective field oxides between the anode $p^+$ and $n^+$ doped regions, between the anode $n^+$ doped region and the vertical zener junction, and between the vertical zener junction and the n-doped well.

DETAILED DESCRIPTION OF THE INVENTION

Figure 1:
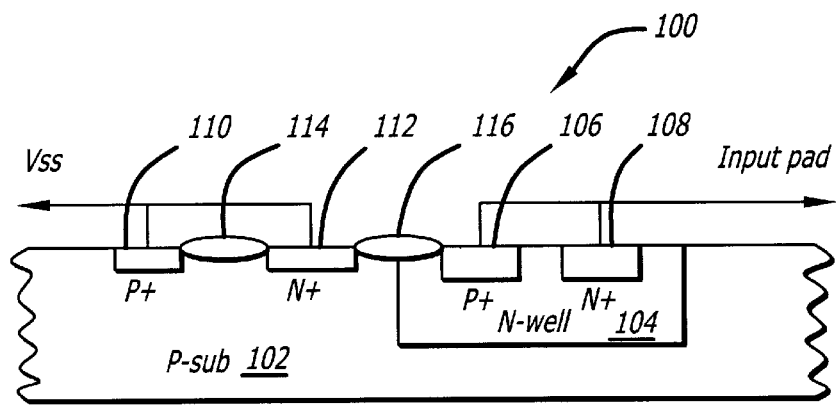
FIG. 1 illustrates a side cross-sectional view of a prior art SCR.
Figure 2:
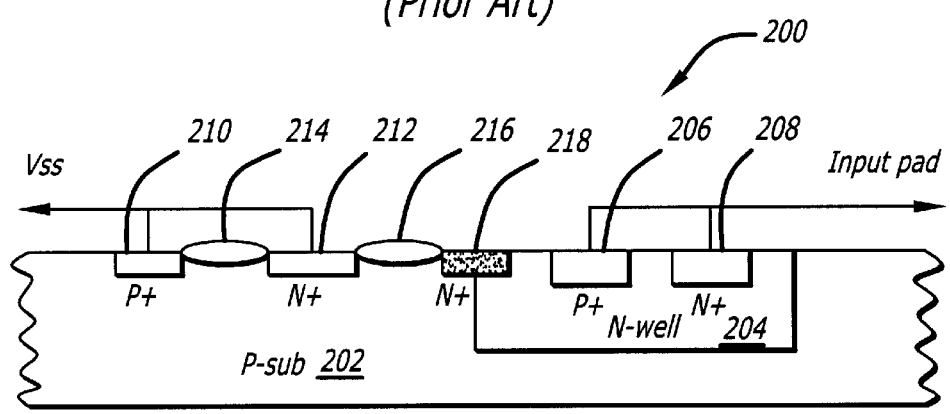
FIG. 2 illustrates a side cross-sectional view of a prior art SCR that includes a mechanism for triggering breakdown at a lower voltage.
Figure 3:
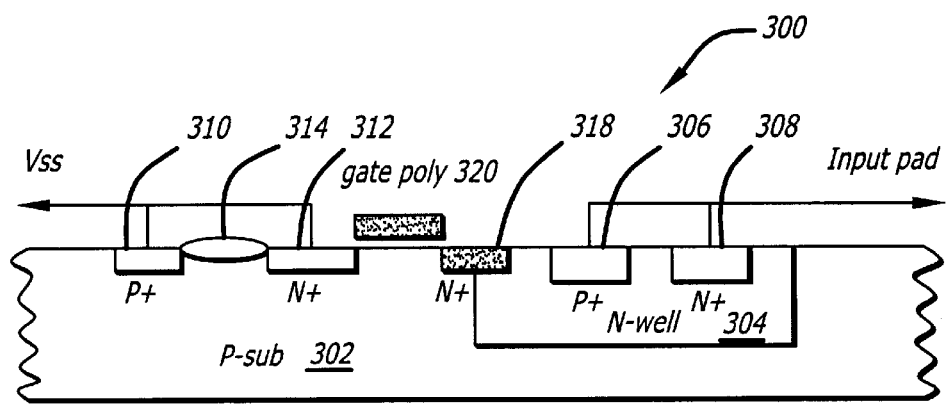
FIG. 3 illustrates a side cross-sectional view of another prior art SCR that includes a mechanism for triggering breakdown at a lower voltage.
Figure 4:
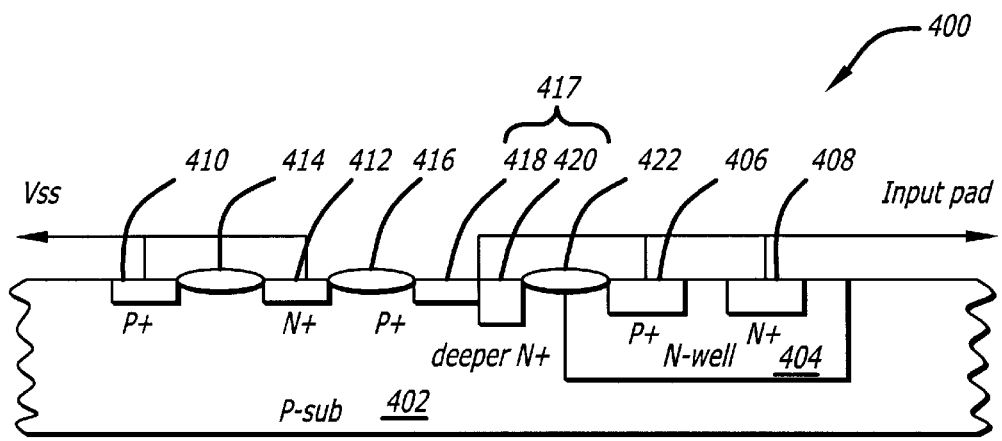
FIG. 4 illustrates a side cross-sectional view of yet another prior art SCR that includes a mechanism for triggering breakdown at a lower voltage.
Figure 5:
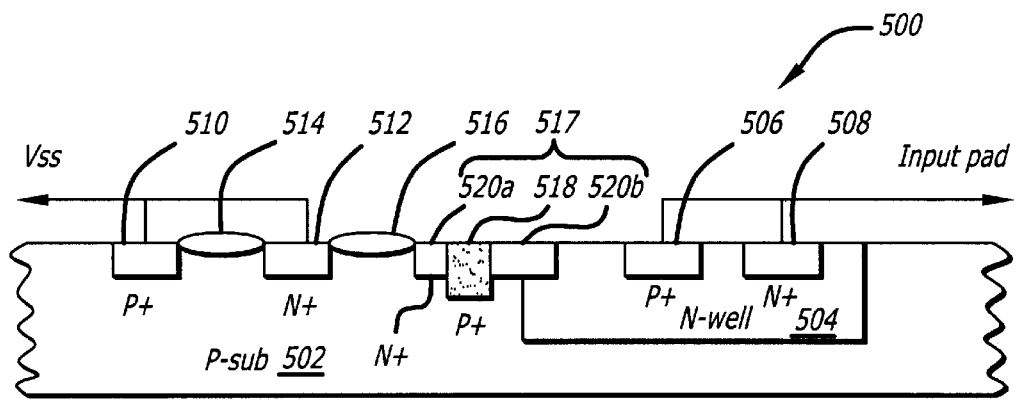
FIG. 5 illustrates a side cross-sectional view of an exemplary SCR in accordance with the invention.

FIG. 5 illustrates a side cross-sectional view of an exemplary SCR 500 in accordance with the invention. The SCR 500 comprises a p-substrate 502 having an n-well 504, spaced apart $p^+$ region 506 and $n^+$ region 508 formed within the n-well 504, spaced apart $p^+$ region 510 and $n^+$ region 512 formed in the p-substrate 502, and a field oxide 514 separating the $p^+$ region 510 from the $n^+$ region 512. To provide a relatively low breakdown voltage, the SCR 500 further includes a vertical zener junction 517 comprised of $p^+$ region 518 sandwiched between two $n^+$ regions 520$a$–$b$. In the preferred embodiment, the $p^+$ region 518 is doped deeper within the p-substrate than the $n^+$ regions 520. The $n^+$ region 520$b$ is formed at least partially within the n-well 504. The vertical zener junction 517 is separated from the $n^+$ region 512 by field oxide 516.

Figure 6:
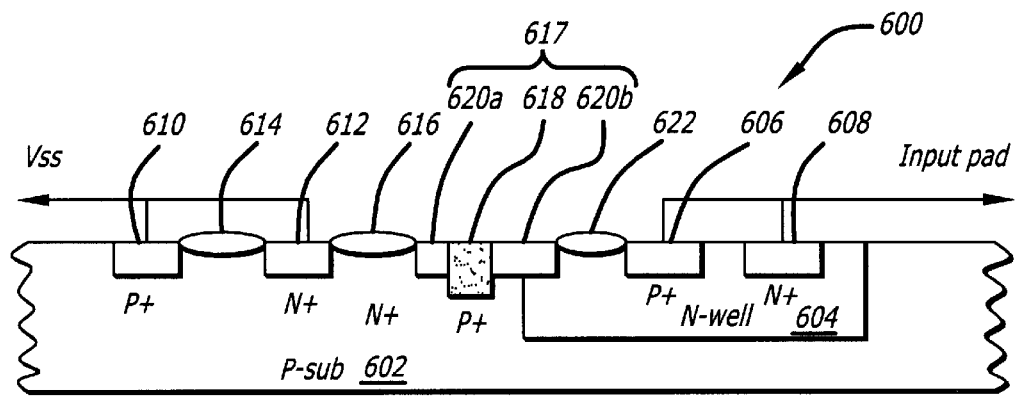
FIG. 6 illustrates a side cross-sectional view of another exemplary SCR in accordance with the invention.

FIG. 6 illustrates a side cross-sectional view of an exemplary SCR 600 in accordance with the invention. The SCR 600 comprises a p-substrate 602 having an n-well 604, spaced apart $p^+$ region 606 and $n^+$ region 608 formed within the n-well 604, spaced apart $p^+$ region 610 and $n^+$ region 612 formed in the p-substrate 602, and a field oxide 614 separating the $p^+$ region 610 from the $n^+$ region 612. To provide a relatively low breakdown voltage, the SCR 600 further includes a vertical zener junction 617 comprised of $p^+$ region 618 sandwiched between two $n^+$ regions 620. In the preferred embodiment, the $p^+$ region 618 is doped deeper within the p-substrate than the $n^+$ regions 620. The vertical zener junction 617 is separated from the $n^+$ region 612 by field oxide 616, and separated from the n-well 604 by field oxide 622.

The SCRs 500 and 600 of the invention have several advantages over prior art SCRs. First, the vertical zener junction can trigger breakdown of the SCRs at relatively low voltages for the required protection, which typically lies above the maximum Vdd and below the gate oxide breakdown voltage. Second, the breakdown voltage of the SCRs can be easily set by proper doping of the $p^+$ region and $n^+$ regions of the vertical zener junction. The region (i.e. either the $p^+$ region or $n^+$ regions) having the lesser doping concentration governs the breakdown voltage of the SCR. Thus, by adjusting the doping concentration of the lighter-doped region of the vertical zener junction, the breakdown voltage for the SCR can be set. This is a relatively simple process procedure for setting the breakdown voltage of the SCR. Third, the breakdown occurs throughout the $p^+$ region, which is a greater breakdown region than the point- or line-like breakdown regions of the prior art SCR 100–300, and the thin plane region of prior art SCR 400. This gives the SCRs of the invention improved current handling capability, thereby making them more reliable and robust.

In the foregoing specification, the invention has been described with reference to specific embodiments thereof. It will, however, be evident that various modifications and changes may be made thereto departing from the broader spirit and scope of the invention. The specification and drawings are, accordingly, to be regarded in an illustrative rather than a restrictive sense.

It is claimed:

1. A silicon controlled rectifier, comprising:

a p-doped substrate;

an n-doped well formed within said p-doped substrate;

a first n$^+$ doped region formed within said n-doped well;

a first p$^+$ doped region formed within said n-doped well, wherein said first p$^+$ doped region is spaced apart from said first n$^+$ doped region;

a second n$^+$ doped region formed within said p-doped substrate outside of said n-doped well;

a second p$^+$ doped region formed within said p-doped substrate outside of said n-doped well, wherein said second p$^+$ doped region is spaced apart from said second n$^+$ doped region;

a first field oxide interposed between said second n$^+$ doped region and said second p$^+$ doped region;

a vertical zener junction comprising a third p$^+$ doped region sandwiched between a pair of third n$^+$ doped regions, wherein said vertical zener junction is situated within said p-doped substrate between said n-well and said second n$^+$ region, and further wherein said third p$^+$ doped region extends deeper into said p-doped substrate than said third n$^+$ doped regions;

a second field oxide interposed between said vertical zener junction and said second n$^+$ doped region; and a third field oxide interposed between said vertical zener junction and said n-doped well.

2. A silicon controlled rectifier, comprising:

a p-doped substrate;

an n-doped well formed within said p-doped substrate;

a first n$^+$ doped region formed within said n-doped well;

a first p$^+$ doped region formed within said n-doped well;

a second n$^+$ doped region formed within said p-doped substrate outside of said n-doped well;

a second p$^+$ doped region formed within said p-doped substrate outside of said n-doped well; and a vertical zener junction comprising a third p$^+$ doped region sandwiched between a pair of third n$^+$ doped regions, wherein said vertical zener junction is formed within said p-doped substrate between said n-well doped region and said second n$^+$ region.

3. The silicon controlled rectifier of claim 2, wherein said third p$^+$ doped region of said vertical zener junction extends deeper into said p-doped substrate than said third n$^+$ doped regions.

4. The silicon controlled rectifier of claim 2, wherein said first p$^+$ doped region is spaced apart from said first n$^+$ doped region.

5. The silicon controlled rectifier of claim 2, wherein said second p$^+$ doped region is spaced apart from said second n$^+$ doped region.

6. The silicon controlled rectifier of claim 5, further including a field oxide interposed between said second p$^+$ doped region and said second n$^+$ doped region.

7. The silicon controlled rectifier of claim of claim 2, further including a field oxide interposed between said vertical zener junction and said second n$^+$ doped region.

8. The silicon controlled rectifier of claim of claim 2, further including a field oxide interposed between said vertical zener junction and said n-doped well.

9. A silicon controlled rectifier, comprising:

a p-doped substrate;

an n-doped well formed within said p-doped substrate;

a first n$^+$ doped region formed within said n-doped well;

a first p$^+$ doped region formed within said n-doped well, wherein said first p$^+$ doped region is spaced apart from said first n$^+$ doped region;

a second n$^+$ doped region formed within said p-doped substrate outside of said n-doped well;

a second p$^+$ doped region formed within said p-doped substrate outside of said n-doped well, wherein said second p$^+$ doped region is spaced apart from said second n$^+$ doped region;

a first field oxide interposed between said second n$^+$ doped region and said second p$^+$ doped region;

a vertical zener junction comprising a third p$^+$ doped region sandwiched between a pair of third n$^+$ doped regions, wherein said vertical zener junction is situated within said p-doped substrate between said n-well and said second n$^+$ region, and further wherein said third p$^+$ doped region extends deeper into said p-doped substrate than said third n$^+$ doped regions;

a second field oxide interposed between said vertical zener junction and said second n$^+$ doped region; and a third field oxide interposed between said vertical zener junction and said n-doped well.

10. A silicon controlled rectifier, comprising:

a p-doped substrate;

an n-doped well formed within said p-doped substrate;

a first n$^+$ doped region formed within said n-doped well;

a first p$^+$ doped region formed within said n-doped well;

a second n$^+$ doped region formed within said p-doped substrate outside of said n-doped well;

a second p$^+$ doped region formed within said p-doped substrate outside of said n-doped well; and a vertical zener junction comprising a third p$^+$ doped region sandwiched between a pair of third n$^+$ doped regions, wherein said vertical zener junction is formed within said p-doped substrate between said n-well doped region and said second n$^+$ region.

11. The silicon controlled rectifier of claim 10, wherein said third p$^+$ doped region of said vertical zener junction extends deeper into said p-doped substrate than said third n$^+$ doped regions.

12. The silicon controlled rectifier of claim 10, wherein said first p$^+$ doped region is spaced apart from said first n$^+$ doped region.

13. The silicon controlled rectifier of claim 10, wherein said second p$^+$ doped region is spaced apart from said second n$^+$ doped region.

14. The silicon controlled rectifier of claim 13, further including a field oxide interposed between said second p$^+$ doped region and said second n$^+$ doped region.

15. The silicon controlled rectifier of claim 10, further including a field oxide interposed between said vertical zener junction and said second n$^+$ doped region.

16. The silicon controlled rectifier of claim of claim 10, further including a field oxide interposed between said vertical zener junction and said n-doped well.

* * * * *